United States Patent
Tews et al.

(10) Patent No.: US 12,055,576 B2
(45) Date of Patent: Aug. 6, 2024

(54) CALCULATING ELECTRIC POWER NOISE DISTRIBUTIONS

(71) Applicant: Schweitzer Engineering Laboratories, Inc., Pullman, WA (US)

(72) Inventors: Cody W. Tews, Portland, OR (US); Nicholas C. Seeley, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 232 days.

(21) Appl. No.: 17/929,101

(22) Filed: Sep. 1, 2022

(65) Prior Publication Data
US 2024/0077529 A1    Mar. 7, 2024

(51) Int. Cl.
*G01R 31/08* (2020.01)
*H02H 1/00* (2006.01)

(52) U.S. Cl.
CPC ......... *G01R 31/086* (2013.01); *H02H 1/0007* (2013.01)

(58) Field of Classification Search
CPC ............................ H02H 1/0007; G01R 31/086
See application file for complete search history.

(56) References Cited

U.S. PATENT DOCUMENTS

| | | |
|---|---|---|
| 6,176,312 B1 | 1/2001 | Tubel |
| 7,281,112 B1 | 10/2007 | Gross |
| 7,565,220 B2 | 7/2009 | Huang |
| 8,024,494 B2 | 9/2011 | Soeda |
| 9,581,976 B2 | 2/2017 | Schweitzer |
| 11,231,999 B2 | 1/2022 | Halladay |
| 2002/0046246 A1 | 4/2002 | Wright |
| 2007/0088973 A1 | 4/2007 | Passerini |
| 2008/0140352 A1* | 6/2008 | Goebel .............. G05B 19/4184 702/183 |
| 2009/0012728 A1 | 1/2009 | Spanier |
| 2009/0140060 A1 | 6/2009 | Stoner |
| 2010/0131109 A1 | 5/2010 | Rasmussen |
| 2010/0286937 A1 | 11/2010 | Hedley |

(Continued)

OTHER PUBLICATIONS

Kontron, PCM-PC Condition Monitoring for industrial PCs, Jan. 2007.

(Continued)

*Primary Examiner* — Scott Bauer
(74) *Attorney, Agent, or Firm* — Jared L. Cherry

(57) ABSTRACT

The present disclosure relates to systems and methods for calculating noise distributions in an electric power system. In one embodiment, a system to calculate a noise distribution in an electric power system may comprise a measurement subsystem to obtain a plurality of raw measurements of a parameter in the electric power system. A noise distribution determination subsystem may be configured to generate a plurality of scaled raw measurements from the plurality of raw measurements, generate a power spectrum density from the plurality of scaled raw measurements, generate a cumulative distribution from the power spectrum density, and determine a noise distribution from the power spectrum density. A protective action subsystem may monitor the parameter in the electric power system to identify a signal of interest by utilizing, at least in part, the noise distribution and generating a control action in response to the signal.

20 Claims, 9 Drawing Sheets

(56) References Cited

U.S. PATENT DOCUMENTS

| | | |
|---|---|---|
| 2011/0012603 A1 | 1/2011 | Bose |
| 2011/0303311 A1 | 12/2011 | Klicpera |
| 2012/0051579 A1 | 3/2012 | Cohen |
| 2013/0173218 A1 | 7/2013 | Maeda |
| 2014/0122800 A1 | 5/2014 | Williams |
| 2014/0198405 A1 | 7/2014 | Huang |
| 2014/0278161 A1* | 9/2014 | Chen .................... G01R 31/088 702/58 |
| 2014/0303913 A1 | 10/2014 | Neti |
| 2016/0369777 A1 | 12/2016 | Chiang |
| 2021/0360420 A1* | 11/2021 | Um ....................... H04W 48/02 |
| 2022/0205956 A1* | 6/2022 | Stephens ............. G01M 5/0025 |

OTHER PUBLICATIONS

Allen, A., et al. "PMU Data Event Detection: A User Guide for Power Engineers." Technical Report NREL/TP-5D00-61664, National Renewable Energy Laboratory (NREL), Oct. 2014.

Allen, Alicia J., et al."Algorithm for Screening PMU Data for Power System Events." 2012 3rd IEEE PES Innovative Smart Grid Technologies Europe (ISGT Europe), Oct. 2012.

Allen, Alicia Jen. "Analysis of Transmission System Events and Behavior using Customer-level Voltage Synchrophasor Data." Dissertation, University of Texas at Austin, May 2013.

Khan, Mukhtaj, et. Al. "Parallel Detrended Fluctuation Analysis for Fast Event Detection on Massive PMU Data." IEEE Transactions on Smart Grid, vol. 6, Issue: 1, Aug. 2014.

Sohn, Sang-Wook, et al. "Event Detection Method for the PMUs Synchrophasor Data." 2012 IEEE Power Electronics and Machines in Wind Applications, Jul. 2012.

Tate, Joseph Euzebe. "Event Detection and Visualization Based on Phasor Measurement Units for Improved Situational Awareness." Dissertation, University of Illinois at Urbana-Champaign, 2008.

Sancho, J. et al. "Evaluation of Harmonic Variability in Electrical Power Systems through Statistical Control of Quality and Functional Data Analysis." The Manufacturing Engineering Society International Conference, MESIC 2013, 2013.

* cited by examiner

Time Domain to Frequency Domain

Histogram Comparison

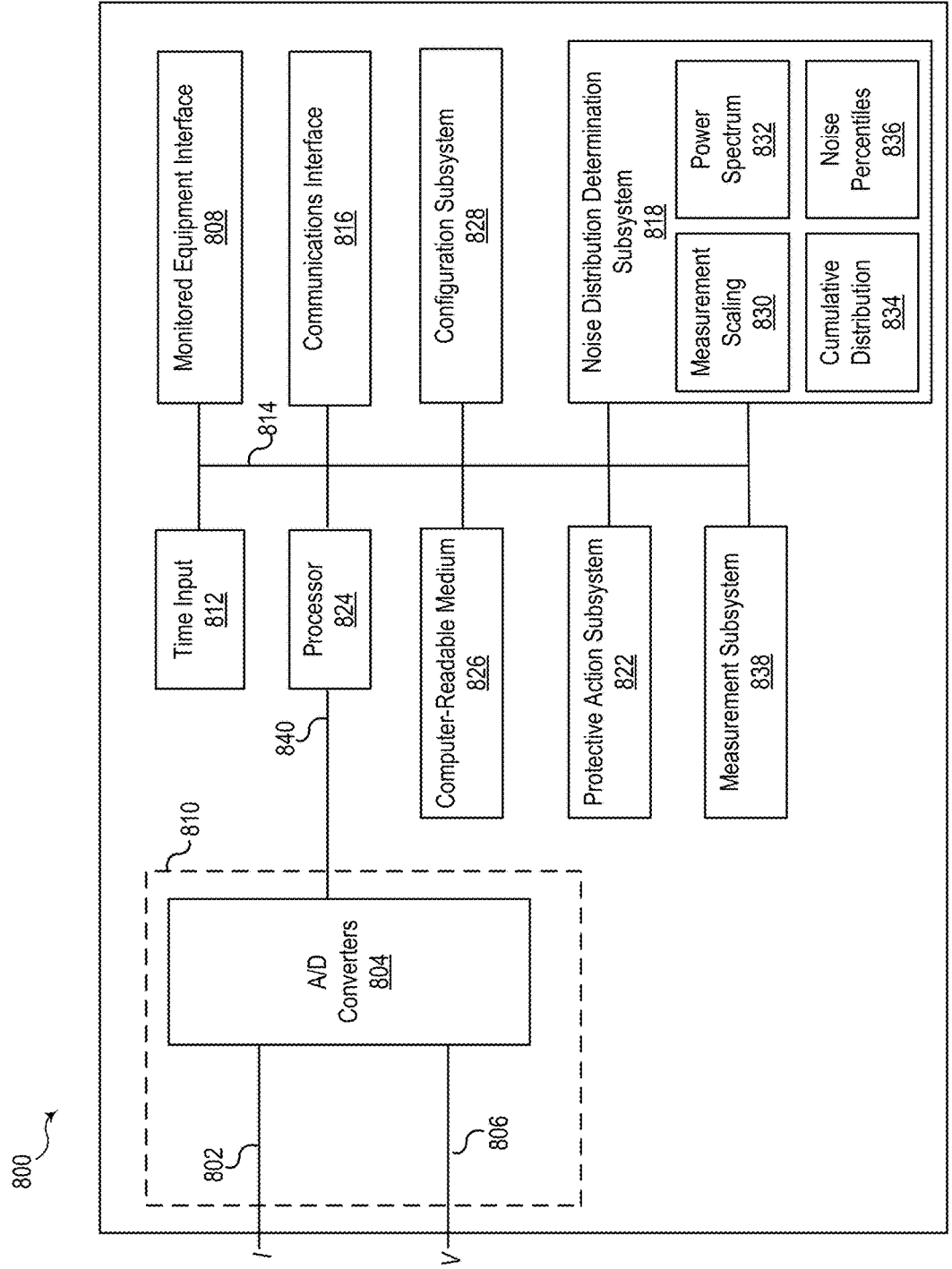

CALCULATING ELECTRIC POWER NOISE DISTRIBUTIONS

GOVERNMENT LICENSE RIGHTS

This invention was made with Government support under FA8750-17-C-0149 awarded by United States Air Force Research Laboratory. The Government has certain rights in this invention.

TECHNICAL FIELD

The present disclosure pertains to calculating and using electric power noise distributions. More particularly, but not exclusively, the present disclosure pertains to using high-frequency measurements to derive an empirical noise profile, and to use the noise distribution profile to monitor, automate, and/or protect an electric power system.

BRIEF DESCRIPTION OF THE DRAWINGS

Non-limiting and non-exhaustive embodiments of the disclosure are described, including various embodiments of the disclosure with reference to the figures, in which:

FIG. 8 illustrates a functional block diagram of a system to determine and use an empirically derived noise profile in in an electric power system consistent with embodiments of the present disclosure.

DETAILED DESCRIPTION

Figure 1:
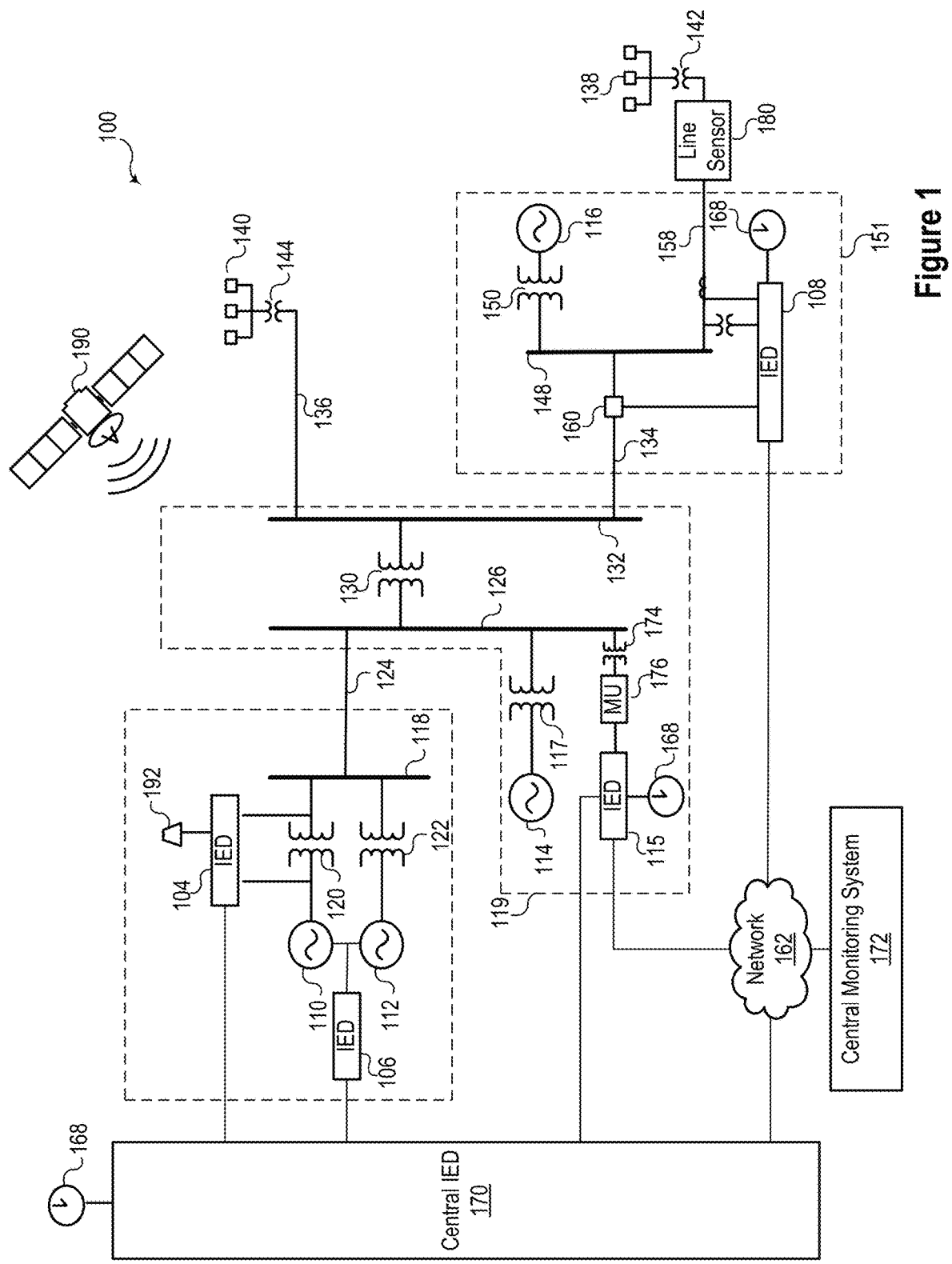
FIG. 1 illustrates a simplified one-line diagram of an electric power system consistent with embodiments of the present disclosure.

Electric power systems are used to generate, transmit, and distribute electric power to loads, and serve as an important part of critical infrastructure. Electric power systems and equipment may be monitored and protected by a variety of types of equipment. Protection relays may analyze the parameters of an electric power system to implement protective functions. The primary protective relays may communicate with various other supervisory devices such as automation systems, monitoring systems, supervisory (SCADA) systems, and other intelligent electronic devices (IEDs). IEDs may collect data from various devices within an electric power system and monitor, control, automate, and/or protect such devices.

As used herein, an IED may refer to any microprocessor-based device that monitors, controls, automates, and/or protects monitored equipment within a system. Such devices may include, for example, differential relays, distance relays, directional relays, feeder relays, overcurrent relays, voltage regulator controls, voltage relays, breaker failure relays, generator relays, motor relays, remote terminal units, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. Further, IEDs may include sensors (e.g., voltage transformers, current transformers, contact sensors, status sensors, light sensors, tension sensors, etc.) that provide information about the electric power system.

One challenge in electric power systems is accurately identifying signals of interest, such as electrical faults. Electrical faults can be difficult to identify because electric power systems have large fluctuations and significant amounts of noise that can obscure signals of concern. For example, a significant and rapid increase in current flow may be caused by connecting a large load or by a short circuit. If the increased current flow is attributable to a short circuit, a protective action should be implemented to interrupt the flow of current to the fault, but if the increased current is caused by connecting a large load, no protective action is necessary.

The inventors of the present disclosure have recognized that the systems and methods disclosed herein may improve monitoring, control, automation, and/or protection of electric power systems by empirically determining noise distributions and using such distributions to identify anomalous conditions. The empirically determined noise distributions may be used to differentiate between signals of interest and other fluctuations in the system, including noise and transient signals. Improvements in differentiating between signals of interest and other signals may improve the operation of an associated system by, among other things, avoiding unnecessary protective actions and improving the reliability of the system.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. A module or component may comprise a single instruction or many instructions and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

FIG. 1 illustrates a simplified one-line diagram of an electric power system 100 consistent with embodiments of the present disclosure. Electric power system 100 may be configured to generate, transmit, and distribute electric energy to loads. Electric power systems may include equipment such as electrical generators (e.g., generators 110, 112, 114, and 116), transformers (e.g., transformers 117, 120, 122, 130, 142, 144, 150, and 174), power transmission and delivery lines (e.g., lines 124, 134, 136, and 158), circuit breakers (e.g., breaker 160), busses (e.g., busses 118, 126, 132, and 148), loads (e.g., loads 138 and 140) and the like. A variety of other types of equipment may also be included in electric power system 100, such as voltage regulators, capacitor banks, and the like.

Substation 119 may include a generator 114, which may be a distributed generator, and which may be connected to bus 126 through step-up transformer 117. Bus 126 may be connected to a distribution bus 132 via a step-down transformer 130. Distribution lines 136 and 134 may be connected to distribution bus 132. Load 140 may be fed from distribution line 136. Further, step-down transformer 144 in communication with distribution bus 132 via distribution line 136 may be used to step down a voltage for consumption by load 140.

Distribution line 134 may lead to substation 151 and deliver electric power to bus 148. Bus 148 may also receive electric power from distributed generator 116 via transformer 150. Distribution line 158 may deliver electric power from bus 148 to load 138 and may include further step-down transformer 142. Circuit breaker 160 may be used to selectively connect bus 148 to distribution line 134. IED 108 may be used to monitor and/or control circuit breaker 160 as well as distribution line 158.

Electric power system 100 may be monitored, controlled, automated, and/or protected using IEDs, such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108, and 115 may be remote from the central IED 170 and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

A common time signal 168 may be used to time-align measurements for comparison and/or synchronize action across electric power system 100. Utilizing a common or universal time source may allow for the generation of time-synchronized data, such as synchrophasors. In various embodiments, the common time source may comprise a time signal from a GNSS system 190. IED 104 may include a receiver 192 configured to receive the time signal 168 from the GNSS system 190. In various embodiments, IED 106 may be configured to distribute the time signal 168 to other components in electric power system 100, such as IEDs 104, 108, 115, and 170.

A voltage transformer 174 may be in communication with a merging unit (MU) 176. MU 176 may provide information from voltage transformer 174 to IED 115 in a format useable by IED 115. MU 176 may be placed near to voltage transformer 174 and may digitize discrete input/output (I/O) signals and analog data, such as voltage measurements. These data may then be streamed to IED 115. In various embodiments, MU 176 may be located outside of a substation enclosure or control house, thus increasing safety by removing high-energy cables from areas where personnel typically work. In various embodiments, MU 176 may be embodied as an SEL-2240 available from Schweitzer Engineering Laboratories of Pullman, Washington.

A variety of sensors, such as line sensor 180, may be distributed throughout electric power system 100 to provide information regarding electrical conditions used for automation, monitoring, and protection. Line sensor 180 may track the frequency of alternating current through transmission line 158 to determine a data sampling period and obtain a specified number of samples per cycle. The sampled data may be provided to IED 108 or another device for use in a variety of applications, such as determining a fault current magnitude, determining a fault direction, and detecting a high impedance fault, etc.

IEDs 104, 106, 108, 115, and/or 170 may generate or utilize noise distributions consistent with the present disclosure. In some embodiments, one or more of the IEDs may monitor an electrical parameter (e.g., voltage) for a period (e.g., a week) and generate a data set for analysis. The data set may then be processed and analyzed, as discussed in greater detail below, to determine a noise profile of a system and to set boundaries for the monitored electrical parameters. In other embodiments, the electrical parameters may be continuously monitored and analyzed to generate and refine a noise profile of a system and to refine boundaries for the system.

Figure 2:
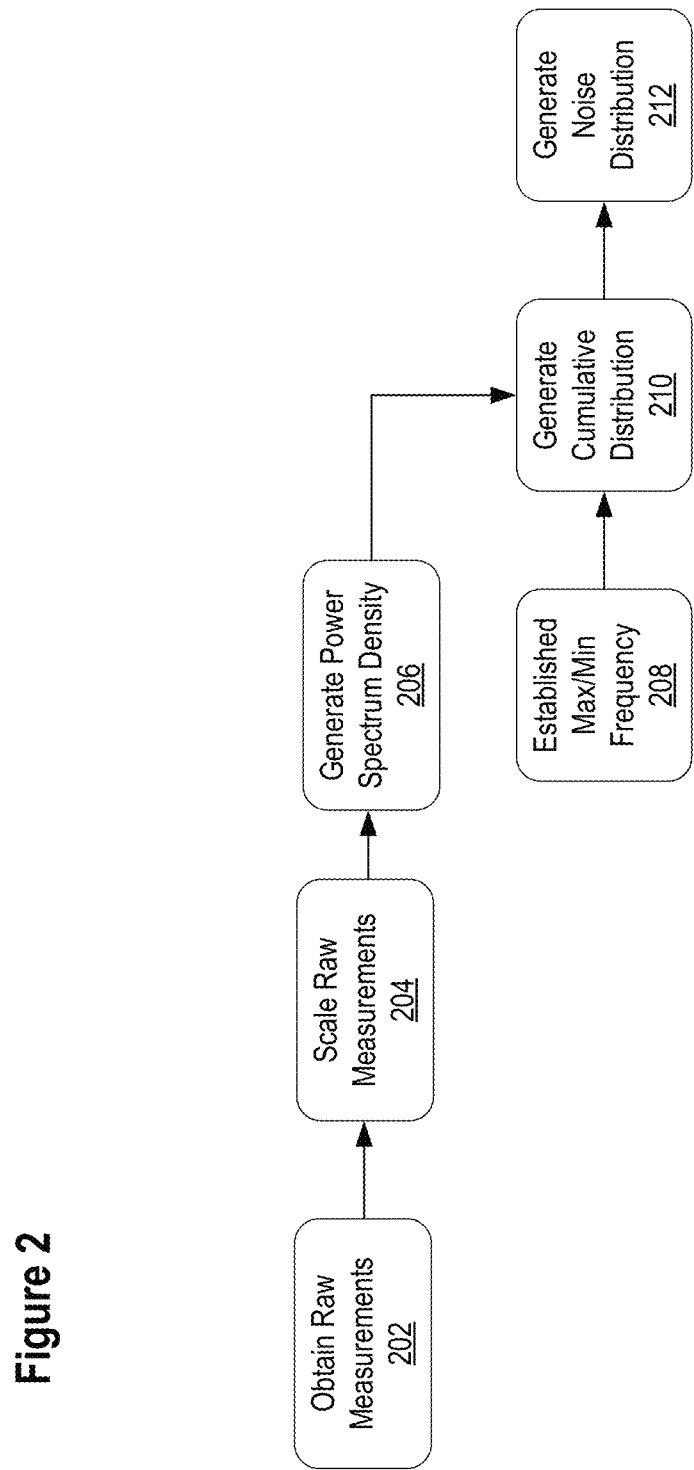
FIG. 2 illustrates a pipeline for deriving an empirical noise profile consistent with embodiments of the present disclosure.

FIG. 2 illustrates a pipeline for deriving an empirical noise profile consistent with embodiments of the present disclosure. At 202, raw measurements of an electric power system may be obtained. The measurements may include long-term, high-frequency measurements. In one embodiment, the measurements may include at least one week of data (i.e., enough to capture daily and weekly variation). Further, in some embodiments, additional raw measurements may be obtained in different seasons to account for seasonal variations. In one embodiment, the high-frequency measurements may be generated using a SEL-T400L Time-Domain Line Protection system from Schweitzer Engineering Laboratories of Pullman, Washington, which has a sampling rate of 1 MHz.

At 204, the raw measurements may be scaled to a suitable range. For example, in a low-voltage system, the measurements may be scaled to a nominal voltage of 120 Root Mean Square ("RMS") voltage. Alternatively, the measurements may be scaled to correspond to generation, transmission, or distribution voltages of an electric power system.

At 206, a power spectrum density may be generated based on the scaled raw measurements. Generating a power spectrum density involves transforming the scaled raw measurements from the time domain to the frequency domain. In one embodiment the transformation may be performed using a Blackman window and Welch's Power Spectral Density (PSD) estimate. The power spectrum density shows the energy contribution from each frequency. The power spectrum density may encompass a broad range (e.g., from 0 to 500,000 Hz). Such a range may be significantly outside of the range typically considered in power system analysis, which is usually limited to a range that includes a few harmonics of a system's fundamental frequency.

At 208, a maximum frequency and a minimum frequency may be established. In some embodiments, the maximum and minimum frequency may be specified by a user, while in other embodiments, the maximum and minimum limits may be extracted from the data. A greater range between the maximum and minimum limits may improve accuracy, but it may also require additional computation. To enable this parallel processing; consistent and appropriate histogram bin spacing may be based on the maximum and minimum values. An optimal bin spacing may be derived from the global maximum and minimum values.

At 210, a cumulative distribution may be generated from the power spectrum density and the maximum and minimum limits set at 208. The cumulative distribution may represent variations in energy distribution over a range of frequencies. The frequencies may be grouped into a plurality of bins and each bin may be analyzed, rather than calculating the cumulative distribution for each frequency. For example, each bin may represent 100 Hz in one embodiment. Other embodiments may include a larger or smaller frequency range in each bin.

At 212, a noise distribution may be generated. In some embodiments, the noise distribution may comprise a determination of various percentile thresholds. Nonparametric statistics may be used to calculate the noise percentiles due to the variation in statistical distribution across the spectrum. The cumulative distribution generated at 201 may use a nonparametric calculation. In one specific embodiment, each hour of spectral measurements may be transformed into a matrix of frequency-probability density results. For a maximum frequency of 100,000 Hz and a minimum of 0 Hz, resultant matrix consists of 1,000 probability density bins into which each measurement across the 100,000 frequencies may be grouped. A specific portion of the data (e.g., one hour) may then be analyzed. Dividing the data into discrete groups may facilitate parallel analysis of the data, and thereby decrease the time necessary to complete the analysis.

A system may utilize the noise distribution generated at 212 to aid in differentiating signals of interest from noise. A variety of types of systems may utilize an empirically determined noise distribution, including monitoring and protection systems. Signals of interest may be relatively small, and as such, may be difficult to differentiate from noise. One specific example includes detection of traveling waves, which can be used in a variety of applications. Examples of the use of traveling waves in electric power systems are discussed in U.S. Pat. Nos. 8,655,609, 8,990,036, and 9,470,748, all of which are assigned to Schweitzer Engineering Laboratories of Pullman, Washington.

Figure 3A:
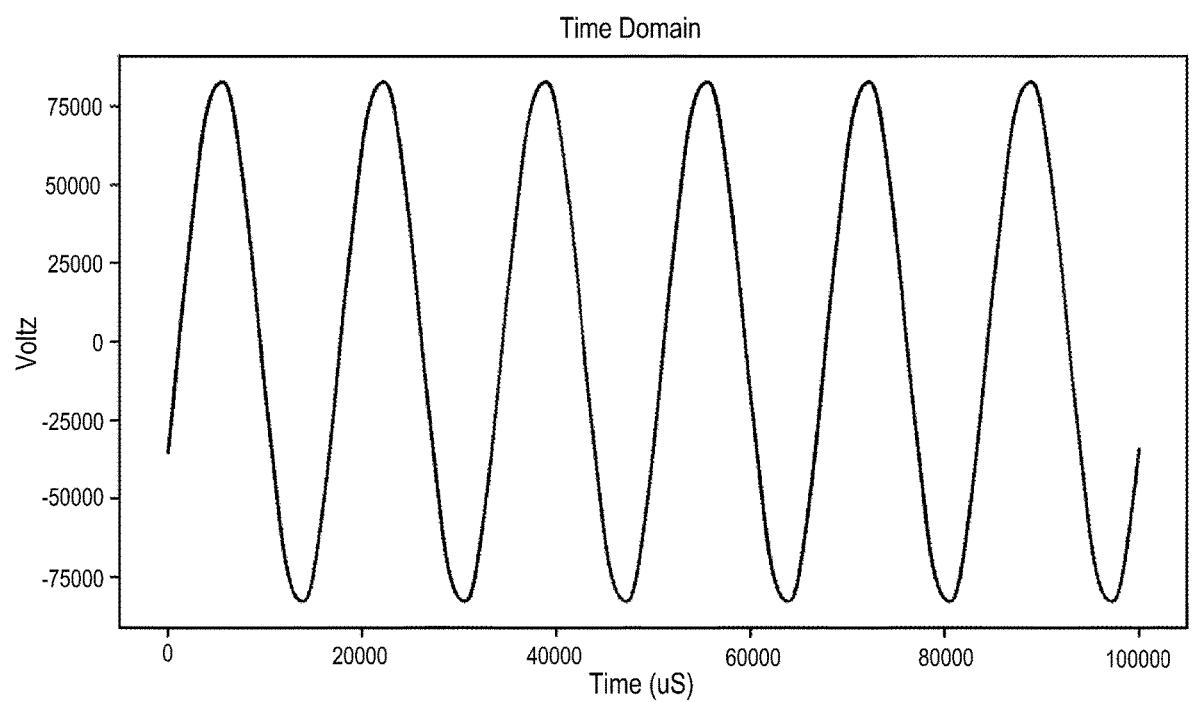
FIG. 3A illustrates a time-domain plot of a sinusoidal voltage signal consistent with embodiments of the present disclosure.

FIG. 3A illustrates a time-domain plot of a sinusoidal voltage signal consistent with embodiments of the present disclosure. Electric power systems commonly have a nominal alternating current frequency of 60 Hz or 50 Hz. In various embodiments consistent with the present disclosure, an electrical parameter may be monitored at a high frequency. In the illustrated embodiment, the voltage signal is sampled at a rate of 1,000,000 samples per second. The time-domain plot shown in FIG. 3A may be representative of the raw measurements described above in connection with element 202 in FIG. 2.

Figure 3B:
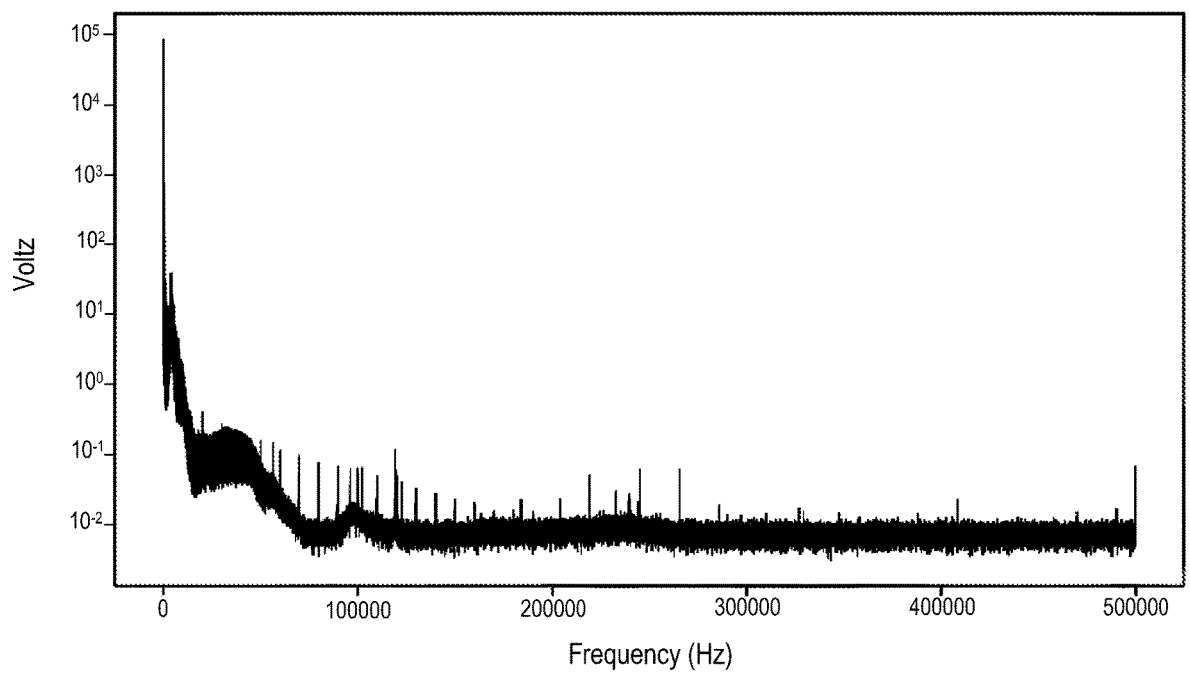
FIG. 3B illustrates a frequency-domain plot of the sinusoidal voltage signal illustrated in FIG. 3A and consistent with embodiments of the present disclosure.

FIG. 3B illustrates a frequency-domain plot of the sinusoidal signal illustrated in FIG. 3A and consistent with embodiments of the present disclosure. The transformation from the time-domain plot shown in FIG. 3A to the frequency domain, as shown in FIG. 3B illustrates the energy contribution from each frequency from DC to 500,000 Hz, and further illustrates that noise energy is not uniform across the frequency spectrum.

Figure 4:
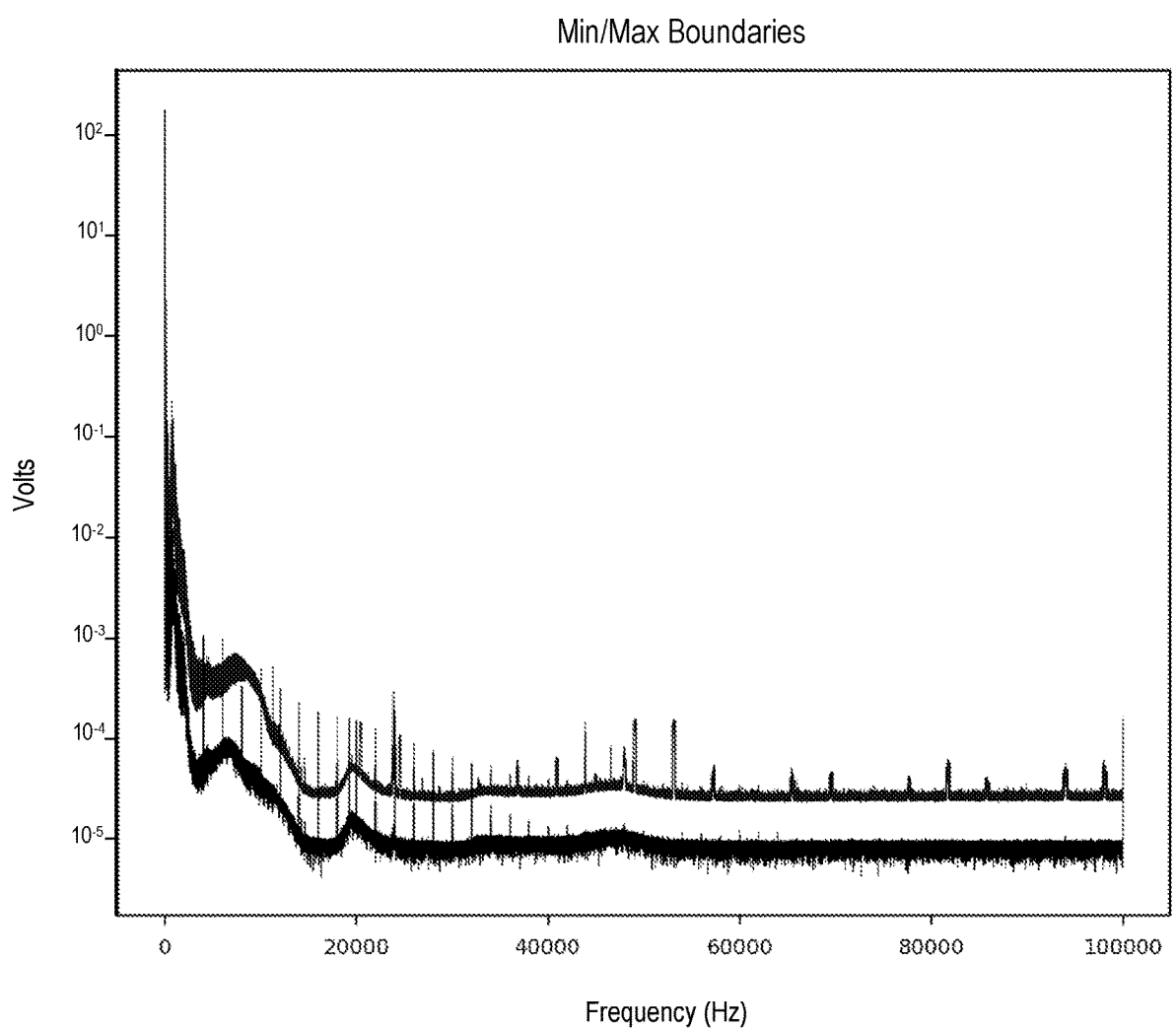
FIG. 4 illustrates a three-dimensional plot of frequency over time and voltage derived from high-frequency measurements of an electric power system consistent with embodiments of the present disclosure.

FIG. 4 illustrates a three-dimensional plot of frequency over time and voltage derived from high-frequency measurements of an electric power system consistent with embodiments of the present disclosure. The three-dimensional plot illustrates a stacking frequency domain transformation of 1,000 seconds of electric power system measurements. In other words, the three-dimensional plot may be similar to the plot illustrated in FIG. 3B, but may show the information over a span of 1,000 seconds.

Boundaries may be extracted from the dataset illustrated in FIG. 4. The boundaries may then be used in further analysis of the data. In various embodiments, the boundaries may be based on nonparametric statistical energy across all frequencies. For example a 25% boundary would use the histogram for each individual frequency, to assess the cumulative energy which resulted in 25% of the measured values. Automated boundaries may be used to permit a user to specify a desired statistical level. Nonparametric statistics may be used because the underlying noise is not Gaussian.

Figure 5A:
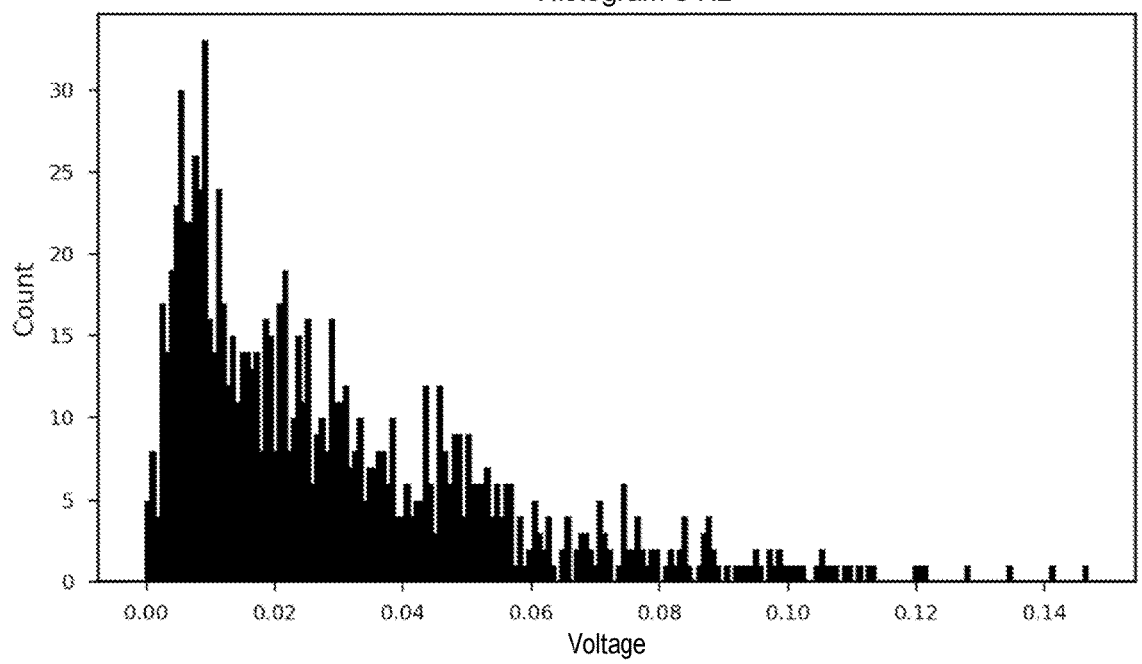
FIG. 5A illustrates histograms at different frequencies and derived from high-frequency measurements on an electric power system and consistent with embodiments of the present disclosure.
Figure 5A:
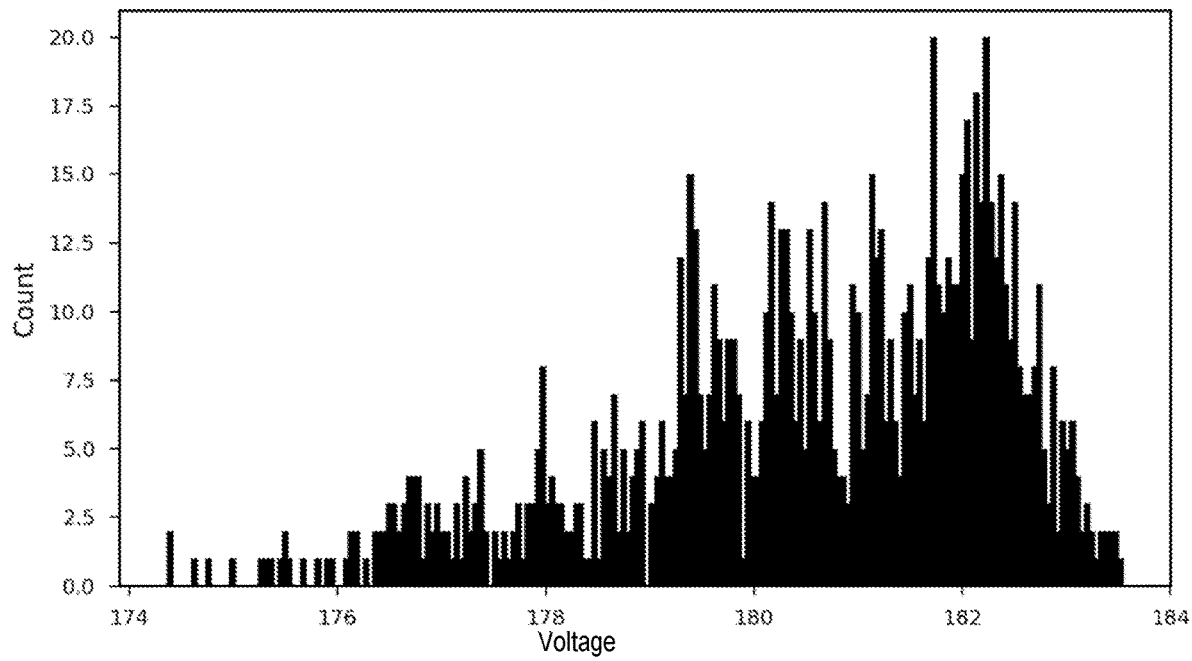
Figure 5B:
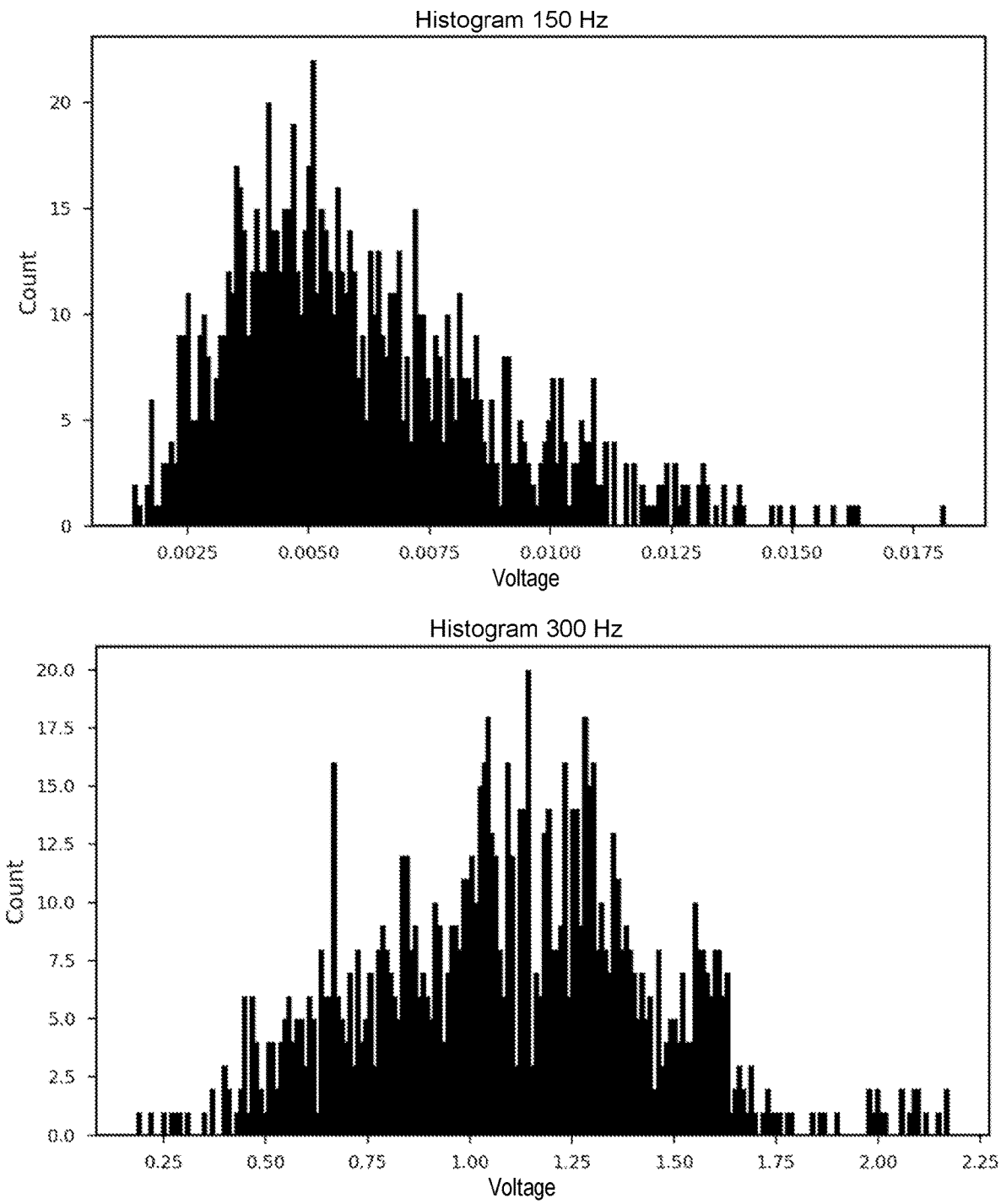
FIG. 5B illustrates histograms at different frequencies and derived from high-frequency measurements of an electric power system and consistent with embodiments of the present disclosure.

FIGS. 5A and 5B illustrate histograms at different frequencies and derived from high-frequency measurements of an electric power system and consistent with embodiments of the present disclosure. The first frequency, 5 Hz, exhibits some characteristics of an Exponential Distribution. The second frequency, 60 Hz, exhibits some characteristics of a Normal Distribution. The third frequency, 150 Hz, exhibits some characteristics of a Chi-Squared Distribution. The final frequency, 300 Hz, exhibits characteristics of a mixture model, perhaps of two Gaussian Distributions. The range of the x-axis in each graph may be established by the range of voltage in the measurements. As demonstrated in FIGS. 5A and 5B, noise energy at different frequencies have different statistical distribution that may justify the use of nonparametric methods. In view of the different distributions, a nonparametric method may be used to analyze the raw data in various embodiments.

Figure 6:
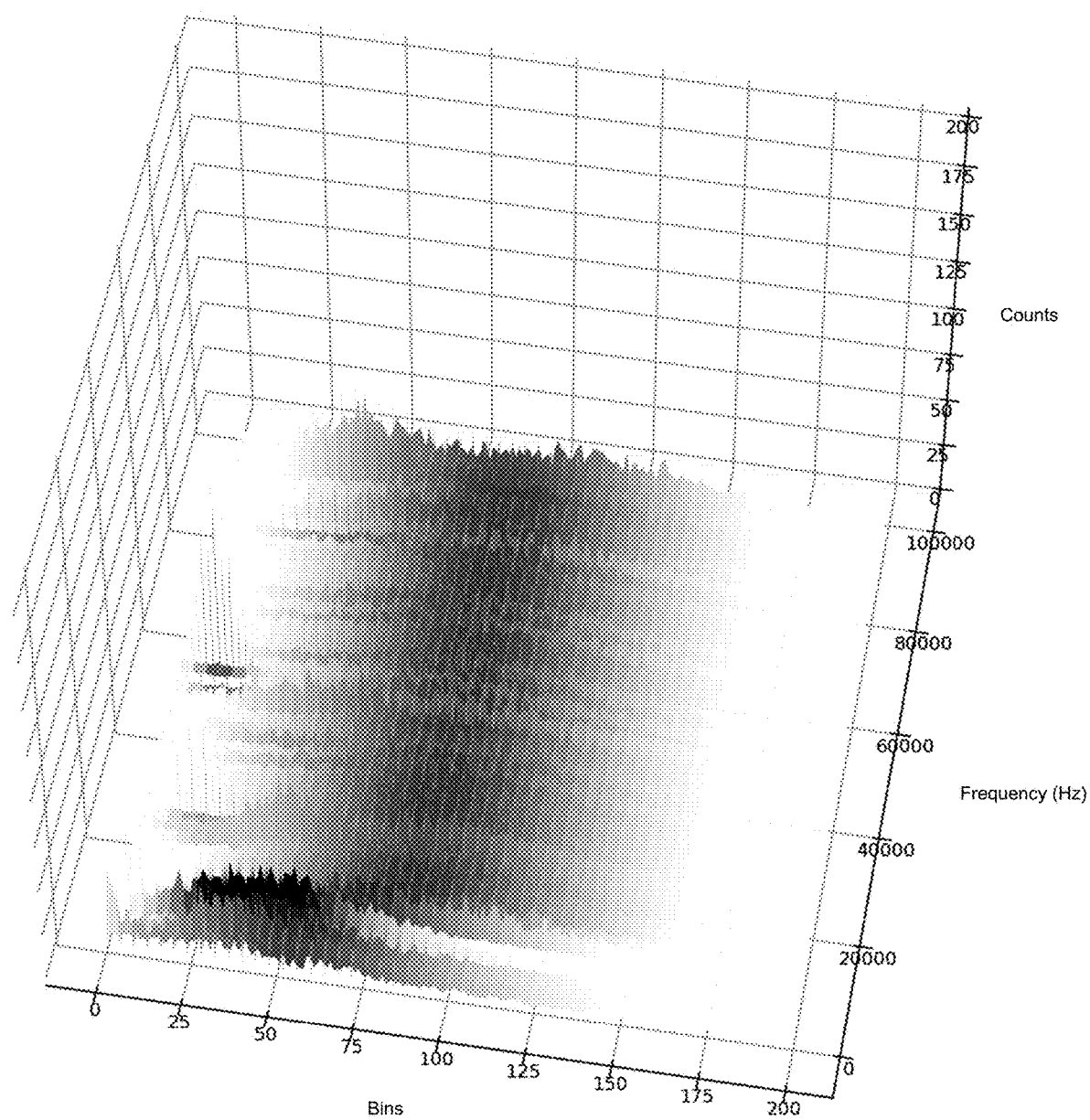
FIG. 6 illustrates a three-dimensional graph of energy distribution of frequency consistent with embodiments of the present disclosure.

FIG. 6 illustrates a three-dimensional graph of energy distribution of frequency consistent with embodiments of the present disclosure. FIG. 6 illustrates the variations in energy distribution at different frequencies. As noted above, such variations may be addressed using nonparametric methods.

Figure 7:
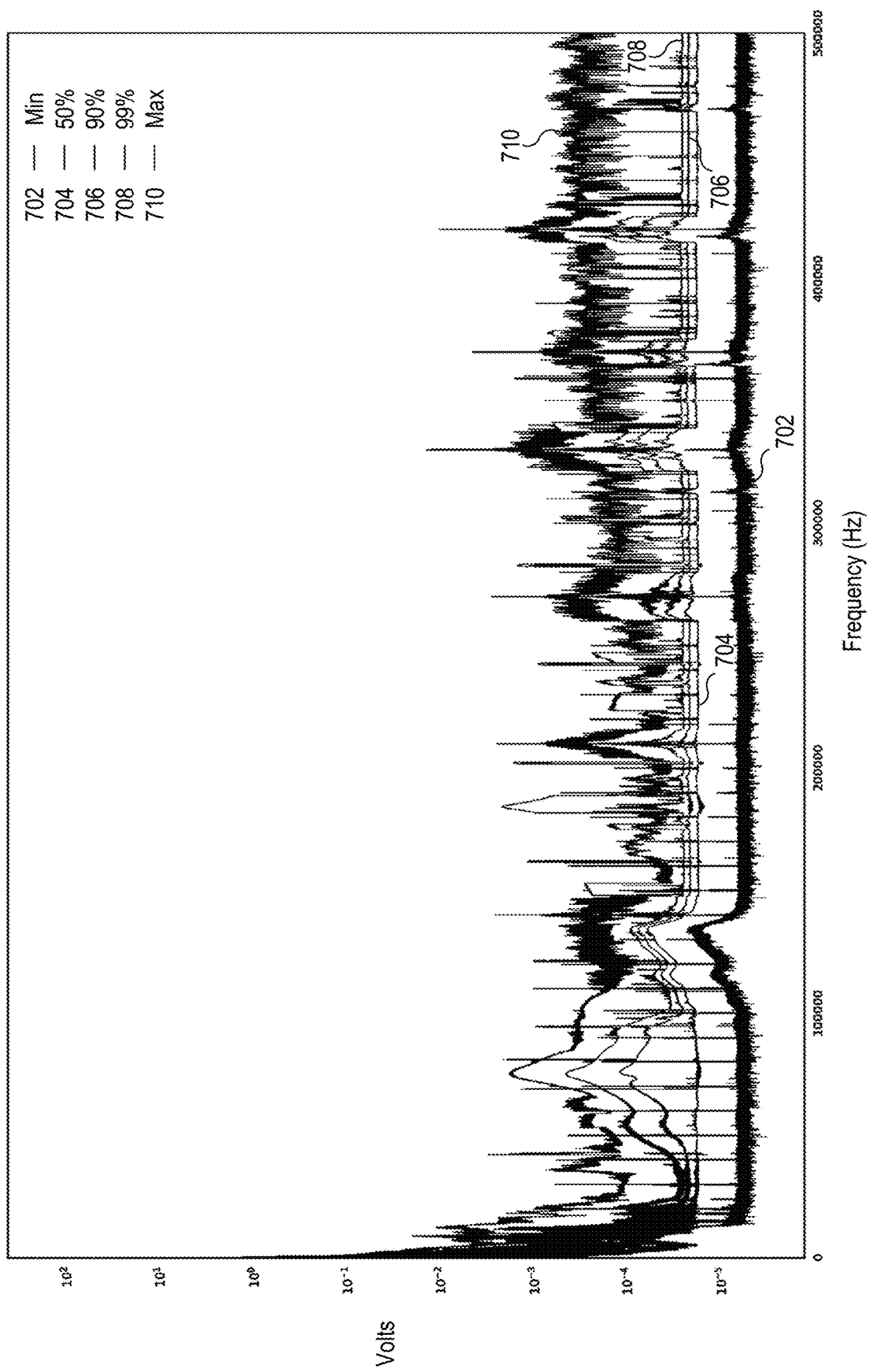
FIG. 7 illustrates a plot of a plurality of noise percentiles over a range of frequencies consistent with embodiments of the present disclosure.

FIG. 7 illustrates a plot of a plurality of noise percentiles over a range of frequencies consistent with embodiments of the present disclosure. The noise percentiles represent the empirical likelihood of the measured voltage occurring at a certain magnitude. The noise percentiles can then be used by an IED to determine, at least in part, whether a given signal is a cause for concern. By empirically determining the noise percentiles, a system may accurately account for noise in connection with control and/or protect algorithms.

FIG. 8 illustrates a functional block diagram of a system 800 to determine and use an empirically derived noise profile in in an electric power system consistent with embodiments of the present disclosure. System 800 may be implemented using hardware, software, firmware, and/or any combination thereof. In some embodiments, system 800 may be embodied as an IED, a protective relay, or other type of device. Certain components or functions described herein may be associated with other devices or performed by other devices. The specifically illustrated configuration is merely representative of one embodiment consistent with the present disclosure.

System 800 includes a communications interface 816 to communicate with relays, IEDs, and/or other devices. In certain embodiments, the communications interface 816 may facilitate direct communication or communicate with systems over a communications network (not shown). System 800 may further include a time input 812, which may be used to receive a time signal (e.g., a common time reference) allowing system 800 to apply a time-stamp to acquired samples. In certain embodiments, a common time reference may be received via communications interface 816, and accordingly, a separate time input may not be required for time-stamping and/or synchronization operations. One such embodiment may employ the IEEE 1588 protocol. A monitored equipment interface 808 may receive status information from, and issue control instructions or protective actions to, a piece of monitored equipment (e.g., a circuit breaker, conductor, transformer, or the like).

Processor 824 processes communications received via communications interface 816, time input 812, and/or monitored equipment interface 808. Processor 824 may operate using any number of processing rates and architectures. Processor 824 may perform various algorithms and calculations described herein. Processor 824 may be embodied as a general-purpose integrated circuit, an application-specific integrated circuit, a field-programmable gate array, and/or any other suitable programmable logic device. A data bus 814 may provide connection between various components of system 800.

Instructions to be executed by processor 824 may be stored in computer-readable medium 826. Computer-readable medium 826 may comprise random access memory (RAM) and non-transitory storage. Computer-readable medium 826 may be the repository of software modules configured to implement the functionality described herein.

System 800 may include a sensor component 810. In the illustrated embodiment, sensor component 810 may receive current measurements 802 and/or voltage measurements 806. The sensor component 810 may comprise A/D converters 804 that sample and/or digitize filtered waveforms to form corresponding digitized current and voltage signals. Current measurements 802 and/or voltage measurements 806 may include separate signals from each phase of a three-phase electric power system. A/D converters 804 may be connected to processor 824 by way of data bus 840, through which digitized representations of current and voltage signals may be transmitted. Sensor component 810 may have a high sampling rate. In one embodiment, the sampling rate may be approximately 1 MHz.

A configuration subsystem 828 may allow an operator to configure various aspects of system 800, including criteria related to a noise profile. For example, an operator may select minimum and/or maximum frequency values. Further, an operator may select a noise percentile (e.g., a 99% threshold, a 95% threshold, etc.) to be used by system 800.

A protective action subsystem 822 may implement a protective action based on various conditions monitored by system 800. In various embodiments, a protective action may include tripping a breaker, selectively isolating or disconnecting a portion of the electric power system, etc. Protective action subsystem 822 may utilize a noise distribution in determining whether a particular signal or measurement triggers a protective action.

A measurement subsystem 838 may be configured to receive a plurality of raw measurements of a parameter in the electric power system. In some embodiments, measurement subsystem 838 may receive the plurality of raw measurements from sensor component 810. In other embodiments, the plurality of raw measurements may be provided to system 800 by another device.

Noise distribution determination subsystem 818 may be configured to derive an empirical noise profile based on a plurality of measurements of one or more electrical parameters. In some embodiments, the raw measurements may be obtained by sensor component 810. In other embodiments that do not include a sensor component 810, the raw measurements may be received via a communications interface 816 from another device. Noise distribution determination subsystem 818 may include a module or subsystem for measurement scaling 830. The raw measurements may be scaled to a suitable range (e.g., 120 volts RMS). Alternatively, the measurements may be scaled to correspond to generation, transmission, or distribution voltages of an electric power system.

Noise distribution determination subsystem 818 may include a module or subsystem for determining a power spectrum 832. Generating a power spectrum density involves transforming the scaled raw measurements from the time domain to the frequency domain. In one embodiment, the transformation may be performed using a Blackman window and Welch's Power Spectral Density (PSD) estimate.

A module or subsystem may be used to generate a cumulative distribution 834 based on the power spectrum density and the maximum and minimum limits. The cumulative distribution may represent variations in energy distribution over a range of frequencies. The frequencies may be grouped into a plurality of bins and each bin may be analyzed, rather than calculating the cumulative distribution for each frequency. For example, each bin may represent 100 Hz in one embodiment. Other embodiments may include a larger or smaller frequency range in each bin.

Noise percentiles 836 may be generated by noise distribution determination subsystem 818. Nonparametric statistics may be used to calculate the noise percentiles due to the variation in statistical distribution across the spectrum. The cumulative distribution may use a nonparametric calculation. In one specific embodiment, each hour of spectral measurements may be transformed into a matrix of frequency-probability density results.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to calculate a noise distribution in an electric power system, comprising:
   a measurement subsystem to obtain a plurality of raw measurements of a parameter in the electric power system;
   a noise distribution determination subsystem configured to:
      generate a plurality of scaled raw measurements from the plurality of raw measurements;
      generate a power spectrum density from the plurality of scaled raw measurements;
      generate a cumulative distribution from the power spectrum density; and
      determine a noise distribution from the power spectrum density; and
   a protective action subsystem to:
      monitor the parameter in the electric power system to identify a signal of interest by utilizing, at least in part, the noise distribution; and
      generate a control action in response to the signal.

2. The system of claim 1, wherein the noise distribution comprises a representation of an amount of energy below a plurality of percentiles.

3. The system of claim 1, wherein the protective action subsystem is further configured to detect the signal by determining a probability of the signal representing noise is less than a threshold.

4. The system of claim 1, wherein the noise distribution determination subsystem is further configured to generate the cumulative distribution between a minimum frequency and a maximum frequency.

5. The system of claim 4, wherein the minimum frequency and the maximum frequency comprise a range of at least 100,000 Hz.

6. The system of claim 1, further comprising a sensor component configured to obtain the plurality of raw measurements.

7. The system of claim 1, wherein the plurality of raw measurements is sampled at a rate of about 1,000,000 samples per second or greater.

8. The system of claim 1, wherein the plurality of raw measurements comprises variations attributable to daily fluctuations in the electric power system.

9. The system of claim 1, wherein the plurality of raw measurements comprises variations attributable to at least weekly fluctuations in the electric power system.

10. The system of claim 1, wherein the plurality of raw measurements comprises variations attributable to seasonal fluctuations in the electric power system.

11. A method for calculating a noise distribution in an electric power system, comprising:
   obtaining a plurality of raw measurements of a parameter in the electric power system;
   generating a plurality of scaled raw measurements from the plurality of raw measurements;
   generating a power spectrum density from the plurality of scaled raw measurements;
   generating a cumulative distribution from the power spectrum density;
   determining a noise distribution from the power spectrum density;
   monitoring the parameter in the electric power system;
   identifying a signal of interest by utilizing, at least in part, the noise distribution; and
   generating a control action in response to the signal.

12. The method of claim 11, wherein the noise distribution comprises a representation of an amount of energy below a plurality of percentiles.

13. The method of claim 11, wherein using the noise distribution in connection with a monitoring system to detect the signal comprises determining a probability of the signal representing noise is less than a threshold.

14. The method of claim 11, further comprising generating the cumulative distribution between a minimum frequency and a maximum frequency.

15. The method of claim 14, wherein the minimum frequency and the maximum frequency comprise a range of at least 100,000 Hz.

16. The method of claim 11, further comprising obtaining the plurality of raw measurements using a sensor component.

17. The method of claim 11, wherein the plurality of raw measurements is sampled at a rate of about 1,000,000 samples per second or greater.

18. The method of claim 11, wherein the plurality of raw measurements comprises variations attributable to daily fluctuations in the electric power system.

19. The method of claim 11, wherein the plurality of raw measurements comprises variations attributable to at least weekly fluctuations in the electric power system.

20. The method of claim 11, wherein the plurality of raw measurements comprises variations attributable to seasonal fluctuations in the electric power system.

* * * * *